United States Patent
Quick et al.

(10) Patent No.: US 9,059,079 B1
(45) Date of Patent: Jun. 16, 2015

(54) PROCESSING OF INSULATORS AND SEMICONDUCTORS

(71) Applicants: UT-Battelle, LLC, Oak Ridge, TN (US); AppliCote LLC., Lake Mary, FL (US)

(72) Inventors: Nathaniel R Quick, Lake Mary, FL (US); Pooran C Joshi, Knoxville, TN (US); Chad Edward Duty, Knoxville, TN (US); Gerald Earle Jellison, Jr., Oak Ridge, TN (US); Joseph Attilio Angelini, Henderson, TN (US)

(73) Assignees: UT-Battelle, LLC, Oak Ridge, TN (US); APPLICOTE, LLC, Lake Mary, FL (US)

(*) Notice: Subject to any disclaimer, the term of this patent is extended or adjusted under 35 U.S.C. 154(b) by 0 days.

(21) Appl. No.: 14/036,925

(22) Filed: Sep. 25, 2013

Related U.S. Application Data (60) Provisional application No. 61/706,099, filed on Sep. 26, 2012.

(51) Int. Cl.
| | |
|---|---|
| H01L 21/22 | (2006.01) |
| H01L 21/38 | (2006.01) |
| H05K 3/44 | (2006.01) |
| H01L 21/223 | (2006.01) |

(52) U.S. Cl.
CPC ........ *H01L 21/22* (2013.01); *H05K 3/44* (2013.01); *H01L 21/223* (2013.01)

(58) Field of Classification Search
USPC .......................................... 438/542
See application file for complete search history.

(56) References Cited

U.S. PATENT DOCUMENTS

| | | | |
|---|---|---|---|
| 3,214,315 | A | 10/1965 | Hildebrand |
| 3,396,401 | A | 8/1968 | Nonomura |
| 3,605,469 | A | 9/1971 | Queralto |
| 3,854,123 | A | 12/1974 | Banach |
| 3,865,564 | A | 2/1975 | Jaeger et al. |
| 3,874,240 | A | 4/1975 | Rembaum |
| 3,943,324 | A | 3/1976 | Haggerty |
| 3,944,640 | A | 3/1976 | Haggerty et al. |
| 3,945,318 | A | 3/1976 | Landsman |

(Continued)

FOREIGN PATENT DOCUMENTS

| | | |
|---|---|---|
| GB | WO 03013757 | 2/2003 |
| JP | 358095830 A | 6/1983 |
| JP | 405024975 A | 2/1993 |

OTHER PUBLICATIONS

Nathaniel R. Quick, Laser Conversion of Ceramic Materials to Electroconductors, International Conference on Electronic Materials—1990, Materials Research Society, Newark, New Jersey, Sep. 17-19, 1990.

(Continued)

*Primary Examiner* — Asok K Sarkar
(74) *Attorney, Agent, or Firm* — Frijouf, Rust & Pyle P.A (57) ABSTRACT

A method is disclosed for processing an insulator material or a semiconductor material. The method includes pulsing a plasma lamp onto the material to diffuse a doping substance into the material, to activate the doping substance in the material or to metallize a large area region of the material. The method may further include pulsing a laser onto a selected region of the material to diffuse a doping substance into the material, to activate the doping substance in the material or to metallize a selected region of the material.

21 Claims, 7 Drawing Sheets

(56) References Cited

U.S. PATENT DOCUMENTS

| | | | |
|---|---|---|---|
| 3,965,328 A | 6/1976 | Locke | |
| 3,981,705 A | 9/1976 | Jaeger et al. | |
| 4,043,170 A | 8/1977 | Erodi et al. | |
| 4,135,902 A | 1/1979 | Oehrle | |
| 4,142,088 A | 2/1979 | Hirsch | |
| 4,159,414 A | 6/1979 | Suh et al. | |
| 4,215,263 A | 7/1980 | Grey et al. | |
| 4,309,224 A | 1/1982 | Shibata | |
| 4,339,285 A | 7/1982 | Pankove | |
| 4,372,989 A | 2/1983 | Menzel | |
| 4,383,843 A | 5/1983 | Iyengar | |
| 4,496,607 A | 1/1985 | Mathias | |
| 4,539,251 A | 9/1985 | Sugisawa et al. | |
| 4,547,650 A | 10/1985 | Arditty et al. | |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Bauerle | |
| 4,691,091 A | 9/1987 | Lyons et al. | |
| 4,710,253 A | 12/1987 | Soszek | |
| 4,761,339 A | 8/1988 | Komatsu et al. | |
| 4,791,239 A | 12/1988 | Sirahata et al. | |
| 4,840,853 A | 6/1989 | Lio et al. | |
| 4,847,138 A | 7/1989 | Boylan et al. | |
| 4,860,442 A | 8/1989 | Ainsworth et al. | |
| 4,872,923 A | 10/1989 | Borodin | |
| 4,880,770 A | 11/1989 | Mir et al. | |
| 4,901,550 A | 2/1990 | Koide | |
| 4,912,087 A | 3/1990 | Aslam et al. | |
| 4,924,033 A | 5/1990 | Iyogi et al. | |
| 4,937,490 A | 6/1990 | Camm | |
| 4,950,558 A | 8/1990 | Sarin | |
| 4,962,085 A | 10/1990 | deBarbadillo, II et al. | |
| 4,988,564 A | 1/1991 | D'Angelo et al. | |
| 5,015,618 A | 5/1991 | Levinson | |
| 5,055,967 A | 10/1991 | Sukonnik et al. | |
| 5,127,364 A | 7/1992 | Savkar et al. | |
| 5,145,741 A | 9/1992 | Quick | |
| 5,149,681 A | 9/1992 | Ohkawa et al. | |
| 5,180,440 A | 1/1993 | Siegel et al. | |
| 5,336,360 A | 8/1994 | Nordine | |
| 5,391,841 A | 2/1995 | Quick | |
| 5,405,481 A | 4/1995 | Licoppe et al. | |
| 5,416,342 A | 5/1995 | Edmond et al. | |
| 5,424,244 A * | 6/1995 | Zhang et al. | 438/301 |
| 5,459,098 A | 10/1995 | Maya | |
| 5,493,096 A | 2/1996 | Koh | |
| 5,549,971 A | 8/1996 | Nordine | |
| 5,629,532 A | 5/1997 | Myrick | |
| 5,680,200 A | 10/1997 | Sugaya et al. | |
| 5,695,828 A | 12/1997 | Ghosh et al. | |
| 5,733,609 A | 3/1998 | Wang | |
| 5,754,299 A | 5/1998 | Sugaya et al. | |
| 5,793,042 A | 8/1998 | Quick | |
| 5,823,039 A | 10/1998 | Umeda et al. | |
| 5,837,607 A | 11/1998 | Quick | |
| 5,847,418 A | 12/1998 | Nakamura et al. | |
| 5,889,234 A | 3/1999 | Ghosh et al. | |
| 5,906,708 A | 5/1999 | Robinson et al. | |
| 5,961,877 A | 10/1999 | Robinson et al. | |
| 6,025,609 A | 2/2000 | Quick | |
| 6,054,375 A | 4/2000 | Quick | |
| 6,064,081 A | 5/2000 | Robinson et al. | |
| 6,174,388 B1 | 1/2001 | Sikka | |
| 6,203,861 B1 | 3/2001 | Kar et al. | |
| 6,221,154 B1 | 4/2001 | Lee et al. | |
| 6,252,197 B1 | 6/2001 | Hoekstra et al. | |
| 6,255,671 B1 | 7/2001 | Bojarczuk et al. | |
| 6,271,576 B1 | 8/2001 | Quick | |
| 6,274,234 B1 | 8/2001 | Dujardin et al. | |
| 6,313,015 B1 | 11/2001 | Lee et al. | |
| 6,334,939 B1 | 1/2002 | Zhou et al. | |
| 6,407,443 B2 | 6/2002 | Chen et al. | |
| 6,497,029 B1 | 12/2002 | Quick | |
| 6,526,327 B2 | 2/2003 | Kar et al. | |
| 6,621,448 B1 | 9/2003 | Lasky et al. | |
| 6,663,826 B1 | 12/2003 | Blue | |
| 6,670,693 B1 | 12/2003 | Quick | |
| 6,732,562 B2 | 5/2004 | Quick | |
| 6,900,465 B2 | 5/2005 | Nakamura et al. | |
| 6,930,009 B1 | 8/2005 | Quick | |
| 6,939,748 B1 | 9/2005 | Quick | |
| 6,998,690 B2 | 2/2006 | Nakamura et al. | |
| 7,013,695 B2 | 3/2006 | Quick | |
| 7,045,375 B1 | 5/2006 | Wu et al. | |
| 7,220,936 B2 | 5/2007 | Ott | |
| 7,237,422 B2 | 7/2007 | Quick | |
| 7,268,063 B1 | 9/2007 | Quick | |
| 7,419,887 B1 | 9/2008 | Quick | |
| 7,603,883 B2 | 10/2009 | Quick | |
| 7,618,880 B1 | 11/2009 | Quick | |
| 7,630,147 B1 | 12/2009 | Quick | |
| 7,811,914 B1 | 10/2010 | Quick | |
| 7,897,492 B2 | 3/2011 | Quick | |
| 7,951,632 B1 | 5/2011 | Quick | |
| 8,067,303 B1 | 11/2011 | Quick | |
| 8,080,836 B2 | 12/2011 | Quick | |
| 8,114,693 B1 | 2/2012 | Quick | |
| 8,393,289 B2 | 3/2013 | Quick | |
| 8,617,669 B1 | 12/2013 | Quick | |
| 8,617,965 B1 | 12/2013 | Quick | |
| 8,674,373 B2 | 3/2014 | Quick | |
| 8,722,451 B2 | 5/2014 | Quick | |
| 8,772,061 B2 | 7/2014 | Quick | |
| 8,828,769 B2 | 9/2014 | Quick | |
| 8,912,549 B2 | 12/2014 | Quick | |
| 2001/0036219 A1 | 11/2001 | Camm | |
| 2002/0067918 A1 | 6/2002 | Camm | |
| 2002/0102098 A1 | 8/2002 | Camm | |
| 2003/0206732 A1 | 11/2003 | Camm | |
| 2006/0289433 A1 * | 12/2006 | Timans | 219/390 |
| 2013/0257270 A1 * | 10/2013 | Rojeski | 315/51 |

OTHER PUBLICATIONS

Nathaniel R. Quick, Direct Conversion of Conductors on Ceramic Substrates, International Society for Hybrid Microelectronics, ISHM 90 Proceedings 1990.

Nathaniel R. Quick and Jeffrey A. Phillips, Laser Processes for Integrating Substrate Fabrication, Proceedings of the International Conference on Lasers '91. The Society for Optical & Quantum Electronics, pp. 537-544 San Diego, CA Dec. 9-13, 1991.

Nathaniel R. Quick and Richard J. Matson, Characterization of a Ceramic Electrical Conductor Synthesized by a Laser Conversion Process, Proceedings of the International Conference on Lasers '91, The Society for Optical & Quantum Electronics, pp. 545-552 San Diego, CA Dec. 9-13, 1991.

Nathaniel R. Quick, Characterization of a Ceramic Sensor Synthesized by a Laser Conversion Process, Proceedings of the International Conference on Lasers '92, The Society for Optical & Quantum Electronics, pp. 881-887 Houston, Texas Dec. 7-10, 1992.

Nathaniel R. Quick, Characterization of a Ceramic Thermal Sensor Synthesized by a Laser Conversion Process, ICALEO '92 (International Congress on Applications of Lasers and Electro-Optics), vol. 75 Laser Materials Processing, Laser Institute of America, pp. 394-404 Oct. 25-29, 1992.

D. K. Sengupta, N. R. Quick and A. Kar, Laser Direct Write of Conducting and Insulating Tracks in Silicon Carbide, Materials Research Society Symposium Proceedings vol. 624 pp. 127-133 2000.

D. K. Sengupta, N. R. Quick and A. Kar, Laser Conversion of Electrical Properties for Silicon Carbide Device Applications, Journal of Laser Applications., 2001, vol. 13, pp. 26-31.

I.A. Salama, N.R. Quick and A. Kar, Laser Doping of Silicon Carbide Substrates, Journal of Electronic Materials, vol. 31, 2002, pp. 200-208.

I.A. Salama, N. R, Quick and A. Kar, Microstructural and electrical resistance analysis of laser-processed SiC substrates for wide bandgap semiconductor materials, Journal of Materials Science, vol. 40, 2005, pp. 3969-3980.

(56) References Cited

OTHER PUBLICATIONS

I.A. Salama, N. R. Quick and A. Kar, Laser Synthesis of Carbon-Rich SiC Nanoribbons, Journal of Applied Physics, vol. 93, 2003, pp. 9275-9281.
I.A. Salama, N.R. Quick, and A. Kar, Laser Direct Write Doping of Wide-Bandgap Semiconductor Materials,IEEE ISCS 2003 Proceedings.
A. Salama, C. F. Middleton, N. R. Quick G. D. Boreman and A. Kar, Laser-Metalized Silicon Carbide Schottky Diodes for Millimeter Wave Detection and Frequency Mixing, Symposium N1 Nitride and Wide Bandgap Semiconductors for Sensors, Photonics and Electronics IV. 204th Meeting of the Electrochemical Society, Orlando, Florida Oct. 12-16, 2003.
A. Salama, N. R. Quick and A. Kar, Laser Direct Metallization of Silicon Carbide without Metal Deposition, Symposium C, New Applications for Wide Bandgap Semiconductors, Materials Research Society, Apr. 23-24, 2003.
I. A. Salama, N. R. Quick and A. Kar. Laser-induced Dopant Incorporation in Wide Bandgap Materials: SiC and GaN, ICALEO 2003 (International Congress on Applications of Lasers and Electro-Optics) Proceedings, 2003.
I.A. Salama, N. R. Quick, and A. Kar, Laser Direct Writing and Doping of Diamond-like Carbon, Polycrystalline Diamond and Single Crystal Silicon Carbide, Journal of Laser Applications. vol. 16, 2004, pp. 92-99.
Z. Tian, N. R. Quick and A. Kar, Laser Direct Write and Gas Immersion Laser Doping Fabrication at SiC Diodes, J: Silicon Carbide Materials, Procesing and Devices, Symposium J Apr. 14-15, 2004.
Z. Tian, N. R. Quick and A. KAr, Laser Doping of Silicon Catbon and PIN Diode Fabrication, 23rd International Congress on Applications of Lasers & Electro-Optics 2004.
A. Kar and N. R. Quick, Laser Processing for Wide Bandgap Semiconductor Device Fabrication, 2004 Meeting of Optical Society of America, 2004.
Z. Tian, I.A. Salama, N. R. Quick and A. Kar, Effects of Different laser Sources and Doping Methods used to Dope Silicon Carbide, Acta Materialia, vol. 53, 2005, pp. 2835-2844.
I.A. Salama. N. R. Quick and A. Kar, Microstructural and electrical resistance analysis of laser-processed SiC substrates for wide bandgap semiconductor materials, Journal of Materials Science, vol. 40. 2005, pp. 3969-3980.
Z. Tian, N. R. Quick and A. Kar; Characteristics of 6H-Silicon Carbide PIN Diodes Prototyping by Laser Doping, Journal of Electronic Materials, vol. 34, 2005, pp. 430-438.
Chong Zhang, A. Salama, N. R. Quick and A. Kar, Two-Dimensional Transient Modeling of CO2 Laser Drilling of Microvias in High Density Flip Chip Substrates, ICALEO 2005 (International Congress on Applications of Lasers and Electro-Optics), Laser Institute of America, Oct. 31-Nov. 3, 2005.
Chong Zhang, S. Bet, A. Salama, N. R. Quick and A. Kar, CO2 Laser Drilling of Microvias Using Diffractive Optics Techniques: I Mathematical Modeling, InterPack 05, The ASME/Pacific Rim Technical Conference on Integration and Packaging of MEMS. NEMS and Electronic Systems, San Francisco, CA Jul. 17-22, 2005.
Z. Tian, N. R. Quick and A. Kar, Laser Synthesis of Optical Structures in Silicon Carbide, 207th Meeting of the Electrochemical Society Proceedings, May 15-20, 2005.
Z. Tian, N.R. Quick and A. Kar, Laser-enhanced diffusion of nitrogen and aluminum dopants in silicon carbide, Acta Materiallia, vol. 54, 2006, pp. 4273-4283.
Z. Tian, N.R. Quick and A. Kar,Laser Direct Write Doping and Metallization Fabrication of Silicon Carbide PIN Diodes, Materials Science Forum, vols. 527-529, 2006, pp. 823-826.
S. Dakshinamurthy, N.R. Quick and A. Kar, SiC-based Optical Interferometry at high pressures and temperatures for pressure and chemical sensing, Journal of Applied Physics, vol. 99, 2006, pp. 094902-1 to 094902-8.
C. Zhang, A. Salama, N. R. Quick and A. Kar, Modelling of Microvia Drilling with a Nd:YAG Laser, Journal of Physics D: Applied Physics 39 (2006) 3910-3918.
Z. Tian, N. R. Quick and A. Kar, Laser Endotaxy and PIN Diode Fabrication of Silicon Carbide, 2006 Spring Meting of Materials Research Society, 2006.
Z. Tian, N. R. Quick and A. Kar, Characteristics of Laser-Fabricated Diodes on Endotaxial Silicon Carbide Substrates, ESCRM (European Conference on Silicon Carbide and Related Materials) Proceedings 2006.
S. Bet, N.R. Quick and A. Kar, Laser Doping of Chromium and Selenium in p-type 4H-SiC, ICSCRM 2007 Symposium.
N. Quick, S. Bet and A. Kar, Laser Doping Fabrication of Energy Conversion Devices Materials Science and Technology 2007 Conference and Exhibition.
S. Bet, N. R. Quick and A. Kar, Effect of Laser Field and Thermal Stress on Diffusion in Laser Doping of SiC, Acta Materialia 55 (2007) 6816-6824.
S. Bet, N. R. Quick and A. Kar, Laser-Doping of Silicon Carbide for p-n Junction and LED Fabrication, Physica Status Solidi (A), vol. 204, No. 4, 2007, pp. 1147-1157.
S. Dakshinamurthy, N.R Quick and A. Kar, Temperature-dependent Optical Properties of Silicon Carbide for Wireless Temperature Sensors, Journal of PhysicsD: Applied Physics 40 (2007)353-360.
S. Dakshinamurthy, N.R., Quick and A. Kar, High temperature optical properties of silicon carbide for wireless thermal sensing, Journal of Physics D: Applied Physics, vol. 40, No. 2, 2007, pp. 353-360.
Chong Zhang, A. Salama, N. R. Quick and A. Kar, Determination of Thermophysical Properties for Polymer Films using Conduction Analysis of Laser Heating, International Journal of Thermophysics, vol. 28, No. 3, Jun. 2007.
N. R. Quick, S. Bet and A. Kar, Laser Doping Fabrication of Energy Conversion Devices, Materials Science and Technology 2007 Conference and Exhibition, Sep. 19, 2007.
S. Bet, N.R. Quick and A. Kar, Laser Doping of Chromium in 6H-SiC for White Light Emitting Diodes, Laser Institute of America, Journal of Laser Applications Vo. 20 No. 1 pp. 43-49 Feb. 2008.
Z. Tian, N. R. Quick and A. Kar, Laser Endotaxy in Silicon Carbide and PIN Diode Fabrication, Laser Institute of America, Journal of Laser Applications, vol. 20 No. 2 pp. 100-115, May 2008.
I. Salama, N, Quick and A. Kar, Laser Direct Write Doping of Wide-Bandgap Semiconductor Materials, ISCS 2003 Proceedings ,2003.
I. Salama, N. Quick and A. Kar, Laser Microprocessing of Wide Bandgap Materials, Proceedings of International Congress on Laser Advanced Materials Processing (LAMP 2002).
S. Bet, N. Quick and A. Kar, Laser Doping of Chromium and Selenium in P-Type 4H-SiC, Materials Science Forum vols. 600-603 (2009) pp. 627-630.
Wai Lek Ng, et al, Nature, vol. 410, Issue 8 (2001)].
S.I. Vlaskina, Silicon Carbide LED, Semiconductor Physics, Quantum Electronics & Optoelectronics , 2002, vol. 5. No. 1, pp. 71-7S, b) S. Kamiyama et al.
Extremely high quantum efficiency of donor-acceptor-pair emission in N-and B-doped 6H-SiC, JAP, 99,093108 (2006).].
Effects of Different Laser Sources and doping methods [Z. Tian., N. R. Quick, and A. Kar, Acta Materialia, vol. 53, (2005), pp. 2835-2844.
[Laser Enhanced Diffusion of Nitrogen and Aluminum Z. Tian, N. R. Quick and A. Kar, Acta Materialia, 54, 4273, (2006)].

\* cited by examiner

PROCESSING OF INSULATORS AND SEMICONDUCTORS

CROSS-REFERENCE TO RELATED APPLICATIONS

This application claims benefit of U.S. Patent Provisional application No. 61/706,099 filed 26 Sep. 2012. All subject matter set forth in provisional application No. 61/706,099 filed 26 Sep. 2012 is hereby incorporated by reference into the present application as if fully set forth herein.

This invention was made with government support under Contract No. DE-AC05-00OR22725 awarded by the U.S. Department of Energy. The government has certain rights in the invention.

BACKGROUND OF THE INVENTION

1. Field of the Invention

This invention relates to insulators and semiconductors, and more particularly to an apparatus and a process for processing of insulator materials and semiconductor materials including the automated processing of the aforesaid materials.

2. Description of the Related Art

The method of processing insulator materials and semiconductor materials in situ by laser synthesis is disclosed in a various patents of Nathaniel R. Quick. The laser synthesis process involves subjecting an insulator material or a semiconductor material to a laser beam in the presence of a specialized atmosphere. The laser synthesis process is able to form conducting electrodes, P-type semiconductors, N-type semiconductors, P-N junctions, P-N-P junction, N-P-N junctions, Schottky diodes, photovoltaic devices, light emitting devices and the like.

The following US patents a representative of the laser synthesis process developed by Nathaniel R. quick et al the disclosures of which are incorporated by reference as if fully set forth herein.

U.S. Pat. No. 6,025,609 issued Feb. 15, 2000 to Quick et al entitled Laser Synthesized Ceramic. Electronic Devices and Circuits and Method for Making.

U.S. Pat. No. 6,054,375 issued Apr. 25, 2000 to Quick et al entitled Method for Making Laser Synthesized Ceramic Electronic Devices and Circuits.

U.S. Pat. No. 6,271,576 issued Aug. 7, 2001 to Quick et al entitled Laser Synthesized Ceramic Sensors and Method for Making.

U.S. Pat. No. 6,670,693 issued Dec. 30, 2003 to Quick et al entitled Laser Synthesized Wide-Bandgap Semiconductor Electronic Devices and Circuits.

U.S. Pat. No. 6,939,748 issued Sep. 6, 2005 to Quick, et al entitled Nano Size Semiconductor Components & Method of Making.

U.S. Pat. No. 6,930,009 issued Aug. 16, 2005 to Quick et al entitled Laser Synthesized Wide Bandgap Semiconductor Electronic Devices and Circuits.

U.S. Pat. No. 7,618,880 issued Nov. 17, 2009 to Quick et al entitled Apparatus & Method for Transforming Substrate.

U.S. Pat. No. 7,268,063 issued Sep. 11, 2007 to Quick et al entitled Process for Fabricating Semiconductor Component.

U.S. Pat. No. 7,419,887 issued Sep. 2, 2008 to Quick et al entitled Laser Assisted Nano Deposition.

U.S. Pat. No. 7,951,632 issued May 31, 2011 to Quick et al entitled Optical Device and Method of Making.

U.S. Pat. No. 7,811,914 issued Oct. 12, 2010 to Quick et al entitled Apparatus and Method for Increasing Thermal Conductivity of a Substrate.

U.S. Pat. No. 7,897,492 issued Mar. 1, 2011 to Quick et al entitled Apparatus & Method for Transforming Substrate.

U.S. Pat. No. 7,951,632 issued May 31, 2011 to Quick et al entitled Optical Device and Method of Making.

U.S. Pat. No. 8,067,304 issued Nov. 29, 2011 to Quick et al entitled Solid State Light Emitting Device and Method of Making.

U.S. Pat. No. 8,080,836 issued Dec. 20, 2011 to Quick et at entitled Process for Fabricating Semiconductor Component.

U.S. Pat. No. 8,114,693 issued Feb. 14, 2012 to Quick et al entitled Method of Fabricating Solid State Gas Dissociating Device by Laser Doping.

Others in the prior art have used pulsed energy from a directed, high density infrared plasma arc lamp for quickly delivering large amounts of heat over large surface areas with little or no deleterious influence upon subsurface compositions. Pulses of infrared energy from the high density infrared plasma arc lamp can supply large power densities over large areas in short time frames in a controlled manner.

The following U.S. Patents are representative of the use of directed, high density infrared plasma are lamps for heating various types of materials the disclosures of which are incorporated by reference as if fully set forth herein.

U.S. Pat. No. 4,937,490 issued on Jun. 26, 1990 to Camm, et al. entitled High intensity Radiation Apparatus And Fluid Recirculating System Therefore.

U.S. Pat. No. 6,174,388 issued on Jan. 16, 2001 to Sikka, et al. entitled Rapid Infrared Heating Of A Surface.

U.S. Pat. No. 6,663,826 issued on Dec. 16, 2003 to Blue, et al, entitled Method of High Density Foil Fabrication.

U.S. Patent Application Publication No. 20010036219 published on Nov. 1, 2001 to Camm, et al. Pulse Thermal Processing Of Functional Materials Using Directed Plasma Arc.

U.S. Patent Application Publication No. 20020067918 published on Jun. 6, 2002 to Camm, et al. Pulse Thermal Processing Of Functional Materials Using Directed Plasma Arc.

U.S. Patent Application Publication No. 20020102098 published on Aug. 1, 2002 to Camm, et al. Pulse Thermal Processing Of Functional Materials Using Directed Plasma Arc.

U.S. Patent Application Publication No. 20030206732 published on Nov. 6, 2003 to Camm, et al Pulse Thermal Processing Of Functional Materials Using Directed Plasma Arc.

U.S. Pat. No. 7,220,936 issued on May 22, 2007 to Ott et al. entitled Pulse Thermal Processing Of Functional Materials using Directed Plasma Arc.

It is an object of the present invention to provide an apparatus and a process for processing of insulating materials and semiconductor materials.

Another object of the present invention is to provide an apparatus and a process for processing of insulating materials and semiconductor materials incorporating laser processing and/or pulse plasma lamp processing of the insulating and semiconductor materials.

Another object of the present invention is to provide an apparatus and a process for processing of insulating materials and semiconductor materials wherein the aforesaid materials are processed within a processing container.

Another object of the present invention is to provide an apparatus and a process for processing of insulating materials and semiconductor materials incorporating the automated system for processing of the aforesaid materials.

Another object of the present invention is to provide an apparatus and a process for processing of insulating materials and semiconductor materials incorporating the automated system incorporating both large area and select narrow area processing.

Another objective of the invention is to tune pulsed thermal processing to comparable laser processing parameters particularly spanning the emission of 1064 nm, 532 nm and 355 nm wavelengths and pulse durations approaching microseconds or less.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a method for processing an insulation material or a semiconductor material, comprising the steps of placing the material into a vessel. A first substance is introduced into the vessel. A plasma lamp is pulsed onto the material in the presence of the first substance to treat large areas of the material with the first substance. A second substance is introduced into the vessel. A laser is pulsed onto a selected region of the material to treat a selected area of the material with the second substance. The treated material is removed from the vessel.

In another embodiment, the invention relates to a method for processing a large scale insulator material or a large scale semiconductor material, comprising the steps of placing the material into a vessel. A doping substance is applied to a surface of the material. A plasma lamp is pulsed for directing electromagnetic radiation onto the surface of the material to diffuse the doping substance into the material. The pulsing of the plasma lamp is terminated upon sufficient diffusion of the doping substance into the material to transform a portion of the material into a doped material.

In a further embodiment, the invention relates to a method for processing an insulator material or a semiconductor material, comprising the steps of placing the material into a vessel. A metal precursor is introduced substance into the vessel. A plasma lamp is pulsed onto the material in the presence of the metal precursor to fuse a metallizing substance onto larges areas of the material. A laser is pulsed onto a selected area of the material to fuse the metallizing substance onto the selected area of the material. The metallized material is removed from the vessel.

In a further embodiment, the invention relates to a method for processing an insulator material or a semiconductor material, comprising the steps of placing the material into a vessel. An inert or reactive gas substance is introduced into the vessel. A plasma lamp is pulsed onto the material in the presence of the inert or reactive gas to phase transform (or convert) an electrically conductive phase region into larges areas of the material. A laser is pulsed onto a selected area of the material in the presence of the inert or reactive gas to phase transform (or convert) a select region of substrate material to an electrically conductive phase into select areas of the material. The electrically conductive material is removed from the vessel.

In still a further embodiment, the invention relates to a method for processing an insulation material or a semiconductor material, comprising the steps of placing the material into a vessel. A metal precursor substance is introduced into the vessel. A plasma lamp is pulsed onto the material in the presence of the metal precursor to phase transform a large area of the material into a metallization composition. A laser is pulsed onto a selected area of the material to phase transform the selected area of the material into a metallization composition. The metallized material is removed from the vessel.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF HE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
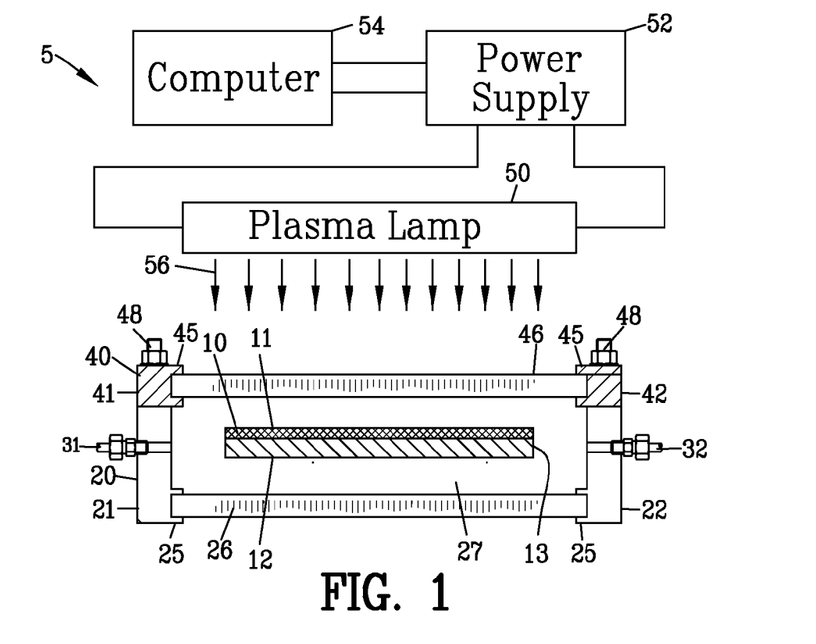
FIG. 1 is a side view partially in section illustrating a pulsed plasma lamp apparatus for processing insulating materials and semiconductor materials within a pulse plasma lamp in concert with a first substance.
Figure 2:
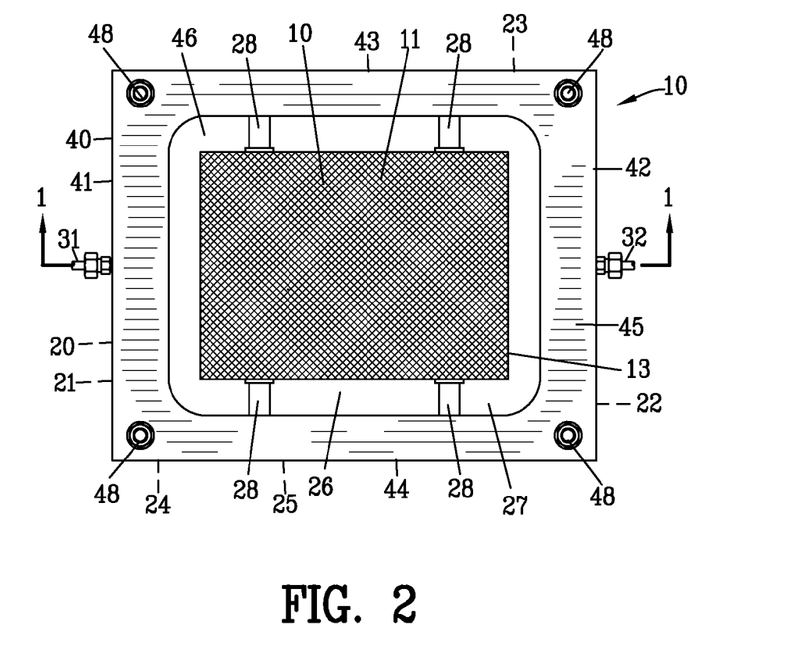
FIG. 2 is a top view of the processing container of FIG. 1.

FIGS. 1 and 2 are side and top views of a first apparatus 5 for processing large areas of an insulation material or a semiconductor material 10. Representative insulation materials 10 include SiO2. Quartz, polymers, Zirconium oxides, Silicon Nitride. Representative semiconductor materials 10 include is a wide bandgap semiconductor such as SiC, AlN, include $SiO_2$, Quartz, polymers, Zirconium oxides, Silicon Nitride, Representative semiconductor materials 10 include is a wide bandgap semiconductor such as SiC, AlN, ZnO, BN, DLC (diamond-like-carbon), GaN, silicon carbide regions in silicon, Tungsten Oxide The material 10 defines a first and a second side 11 and 12 and a peripheral edge 13. Although the material 10 is shown as a rectangle, the present invention is not limited by the physical configuration of the material 10 as shown herein.

The material 10 is shown located in an air-tight vessel 20. The vessel 20 comprises a plurality of wall 21-24 and a bottom wall 25. In this example, the vessel 20 is formed of an aluminum material but it should be understood that various material may be used for the vessel 20.

The bottom wall 25 includes a light transmitting bottom window 26. The light transmitting bottom window 26 is selected to be transparent to the electromagnetic radiation required during the processing of the material 10 as will be hereinafter described. Representative examples of the bottom transparent window 26 include fused silica and fused quartz. The plurality of walls 21-24 in combination with the bottom wall 25 define an interior space 27 for receiving the material 10.

In this example, the material 10 is suspended within the interior space 47 of the vessel 20 by a plurality of supports 28. It should be appreciated by those skilled in the art that various types of supports 28 may be utilized within the vessel 20 depending upon the specific type and specific configuration of the material 10.

An inlet port 31 and an outlet port 32 are located in the side all 21 and 22 of the vessel 20 for injecting and removing fluid substances (not shown) into and out of the vessel 20, respectively. The fluid substances (not shown) may include doping substances, metallizing substances as well as cleaning substances as will be described in greater detail hereinafter.

A closure 40 comprises a plurality of wall 41-44 and a top wall 45. In this example, the closure 40 is formed of an aluminum material but it should be understood that various material may be used for the closure 40. The top wall 45 includes a light transmitting top window 46. The closure 40 is adapted to mate with the vessel 20 to form an airtight seal. A plurality of fasteners 48 secure the closure 40 to the vessel 20.

The apparatus 5 for processing the material 10 comprises a plasma lamp 50 for irradiating the material 10 within the vessel 10. The plasma lamp 50 is powered by a power supply 52 controlled by a computer 54. The computer 54 controls the intensity, pulse duration and the pulse frequency of the plasma lamp 50. The electromagnetic radiation emanating from the plasma. lamp 50 is transmitted through the light transmitting top window 46 of the top wall 45 to irradiate the material 10 in accordance with a computer program stored in the computer.

A suitable plasma lamp 50 is described in U.S. Pat. No. 4,937,490 and U.S. Pat. No. 7,220,936 that are incorporated by reference into the present specification as if fully set forth herein. The plasma lamp 50 can supply large power densities, (up to 20,000 Watts/centimeter$^2$) over large areas (4 meter$^2$) in short time frames (0.5 microseconds to 10.0 seconds).

The plasma lamp 50 is capable of quickly delivering large amounts of heat over large surface areas with little no deleterious influence upon subsurface compositions. The computer 54 controls the pulse energy from the plasma lamp 50 in both duration and/or periodicity to allow precise control over various process parameters. In the process of the present invention, the plasma lamp 50 is used for processing large areas or the entirety of the material 10.

The electromagnetic radiation emanating from the plasma lamp 50 is transmitted through the light transmitting top window 46 of the vessel 20 to irradiate the material 10 in accordance with a computer program stored in the computer. The interior space 27 of the vessel 20 may be a vacuum, a liquid substance, a fluid substance or a gas or vapor substance. In some application, a powdered substance may be introduced into the interior space 27 of the vessel 20.

Figure 3:
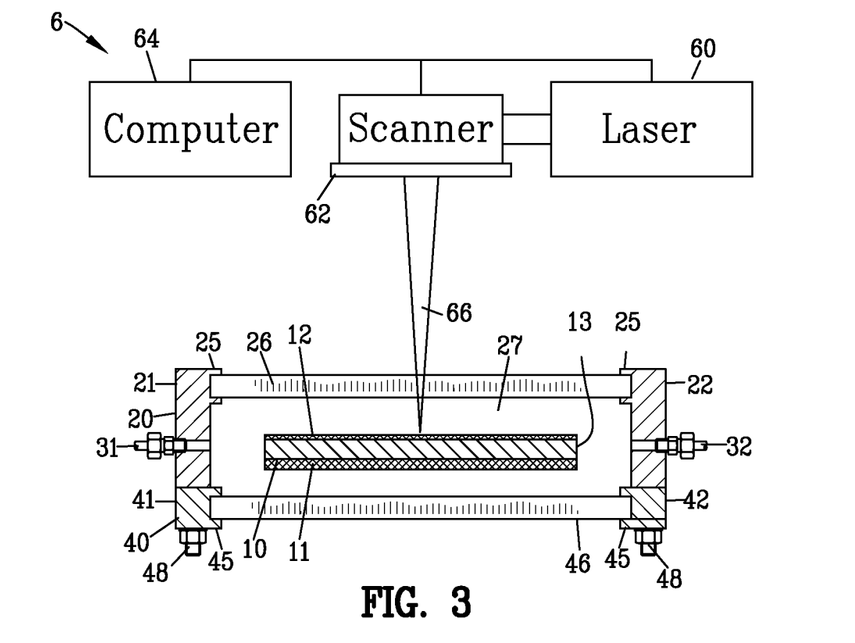
FIG. 3 is a side view partially in section illustrating a laser apparatus for processing insulating materials and semiconductor materials within a laser beam in concert with a second substance.
Figure 4:
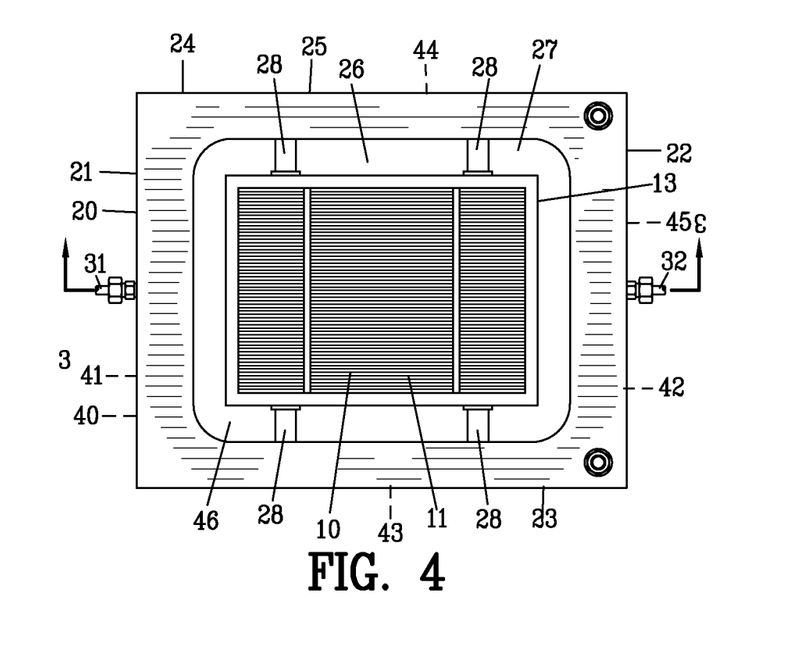
FIG. 4 is a top view of the processing container of FIG. 3.

FIGS. 3 and 4 are side and top views of a second apparatus 6 for processing a selected area of the insulation material or the semiconductor material 10 within the vessel 20 The apparatus 6 comprises a laser 60 directed into a scanner 62. The laser 60 and the scanner 62 are controlled by a computer 64. The laser 60 and the scanner 62 create a focused laser beam 66. The computer 64 controls the pulse frequency of the laser 60 and the position of the laser beam 66.

The vessel 20 and the closure 40 are shown inverted in FIGS. 3 and 4 relative to the position shown in FIGS. 1 and 2. The scanner 62 enables the focused laser beam 66 to be positioned at various locations on the material 10 within the vessel 10. The electromagnetic radiation emanating from the laser 60 is transmitted through the light transmitting bottom window 26 of the bottom wall 45 to irradiate the material 10 in accordance with a computer program stored in the computer.

One example of a laser 60 suitable for the present invention is a Nd:YAG laser emitting a 1064 nm wavelength (near infrared). Another example of a laser 60 suitable for the present invention is a frequency double $2\overline{\omega}$ Nd:YAG laser emitting 532 nm wavelength. Another example of a laser 60 suitable for the present invention is a frequency tripled $3\overline{\omega}$ Nd:YAG laser emitting 355 nm wavelength. A further example of a laser 60 suitable for the present invention is an Excimer laser.

The laser 60 can supply very intense power densities over very small areas (2 millimeter diameter) in very short pulses (nano seconds). The computer 64 controls the pulse energy from the laser 60 in both duration and/or periodicity to allow precise control various process parameters. In the process of the present invention, the laser is used for processing specific areas of the material 10.

Discussion of using a laser for processing a material 10 are discussed in U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No.

6,271,576, U.S. Pat. No. 6,670,693, U.S. Pat. No. 6,930,009, U.S. Pat. No. 6,939,748, U.S. Pat. No. 7,013,695, U.S. Pat. No. 7,237,422, U.S. Pat. No. 7,268,063, U.S. Pat. No. 7,419,887, U.S. Pat. No. 7,618,880; U.S. Pat. No. 7,951,632, U.S. Pat. No. 7,811,914, U.S. Pat. No. 7,897,492, U.S. Pat. No. 7,951,632, U.S. Pat. No. 8,067,304, U.S. Pat. No. 8,080,836 and U.S. Pat. No. 8,114,693 are hereby incorporated by reference into the present application.

Figure 5:
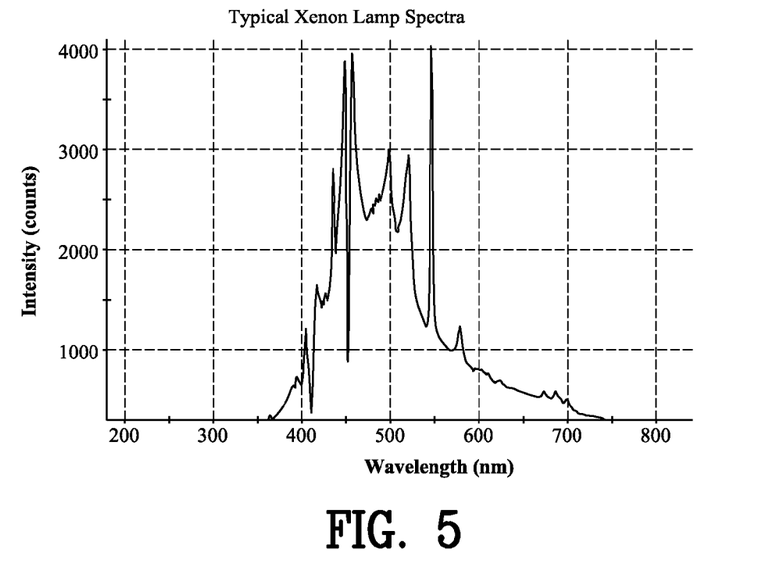
FIG. 5 is a graph illustrating a spectrum emission of a Xenon plasma lamp.

FIG. 5 is a graph illustrating a spectrum emission of a Xenon plasma lamp suitable for the plasma lamp 50 of FIGS. 1 and 2. The spectrum emission of the Xenon plasma lamp peaks at 450 nm and 550 nm. The spectrum emission of the Xenon plasma lamp substantially matches the emission of the frequency double $\overline{2\omega}$ Nd:YAG laser emitting 532 nm wavelength.

Figure 6:
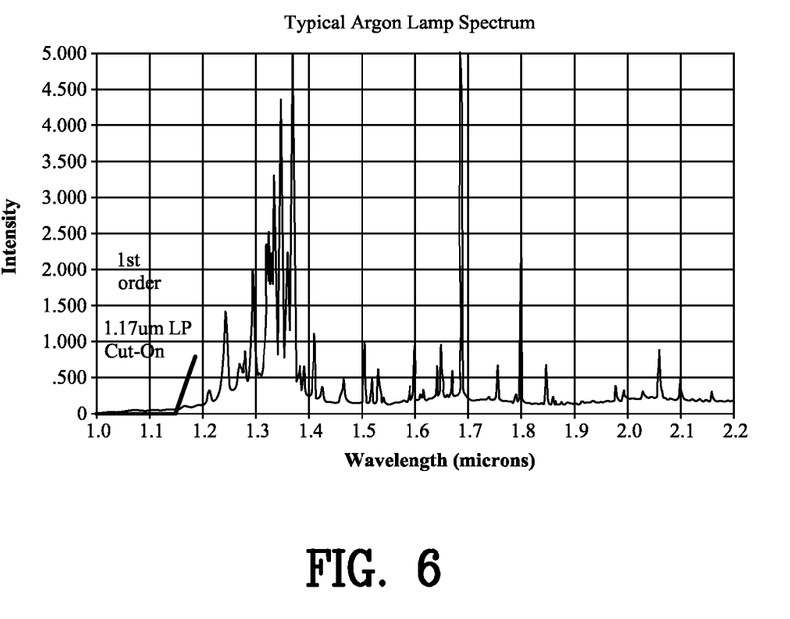
FIG. 6 is a graph illustrating a spectrum emission of an Argon plasma lamp.

FIG. 6 is a graph illustrating a spectrum emission of an Argon plasma lamp 50 suitable for the plasma lamp 50 of FIGS. 1 and 2. The spectrum emission of the Argon plasma lamp peaks at 1.355 nm. The spectrum emission of the Argon plasma lamp substantially matches the emission of the Nd:YAG laser emitting 1.064 nm wavelength.

Figure 7:
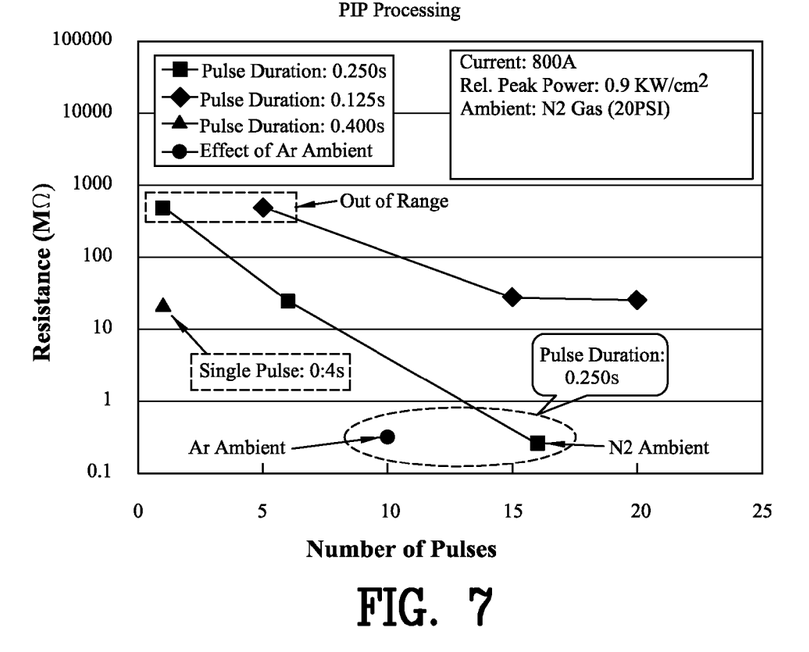
FIG. 7 is a graph illustrating the resistance of a material in the presence of a doping gas as a function of number of pulses of a pulsed plasma lamp apparatus.

FIG. 7 is a graph illustrating the resistance of the material 10 in the presence of a doping gas as a function of number of pulses of the pulsed plasma lamp 50. The graph demonstrates the activation of a dopant in a silicon carbide (SiC) material 10.

EXAMPLE 1

All the silicon carbide (SiC) samples showed high electrical resistance under as received conditions. The resistance value exceeded 500 megaohms for all the samples. The current to the plasma lamp 50 was kept constant at 800 amperes while the pulse duration and number of pulses were varied to activate the dopants. A single pulse of 0.4 seconds duration was effective in reducing the resistance value to low values below 500 Kohms; while a pulse duration of 0.25 seconds was ineffective. For pulse duration of 0.25 seconds; the resistance value was found to decrease with an increase in the number of pulses in the entire investigated range. A similar trend was observed for pulse duration of 0.125 seconds. The Argon ambient also resulted in a significantly lower electrical resistance after processing by the pulsed plasma lamp 50. The observed results suggest that the improvement the electrical conductivity was due to the activation of dopants in the bulk of the material rather than the activation of any diffused nitrogen below the surface.

Figure 8:
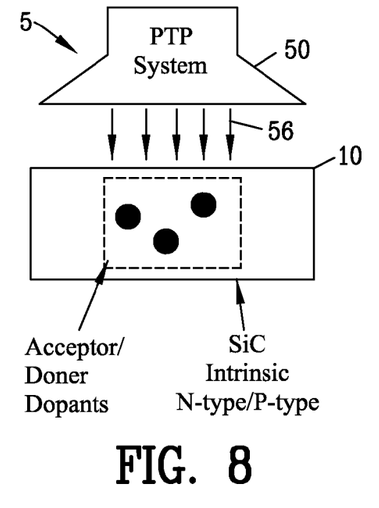
FIG. 8 illustrates the process of diffusing acceptor/doner dopants into a semiconductor with a pulsed plasma lamp apparatus.

FIG. 8 illustrates the process of diffusing acceptor/doner dopants into a semiconductor material 10 with the pulsed plasma lamp apparatus 5. In this example, the pulsed plasma lamp apparatus 5 produces electromagnetic radiation over the entirety of the semiconductor material 10 to diffuse acceptor dopants or doper dopants into the entirety of the semiconductor material 10.

Figure 9:
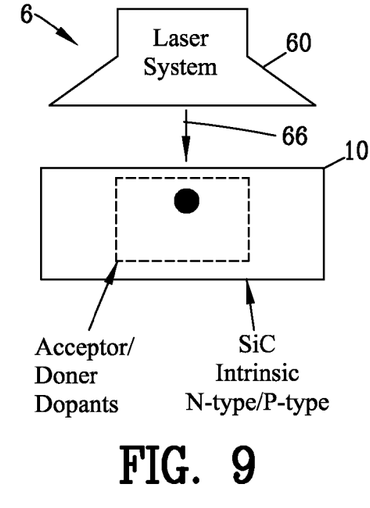
FIG. 9 illustrates the process of diffusing acceptor/doner dopants into a semiconductor with a laser apparatus.

FIG. 9 illustrates the process of diffusing acceptor/doner dopants into a semiconductor material 10 with the laser apparatus 6. In this example, the laser apparatus 5 produces electromagnetic radiation over a specific area of the semiconductor material 10 to diffuse acceptor dopants or (loner dopants into the specific area of the semiconductor material 10.

FIGS. 8 and 9 illustrate the diffusion of acceptor/doner dopants into a silicon carbide (SiC) semiconductor material 10. The dopant activation in silicon carbide (SiC) is based on the dopant induced strain modification in the silicon carbide (SIC) and/or the creation of embedded P-type and N-type regions in the indirect bandgap semiconductor. Each dopant can contribute single or multiple charge carriers depending on the charge state with respect to the host matrix. The embedded P-N junctions can be created by exposing the doped regions of the semiconductor to optical radiation of suitable wavelength and energy density. The dopant activation can be carried out in a discrete silicon carbide (SIC) wafer or a silicon carbide (SiC) material integrated on suitable substrate such as Si, glass, plastic and the like. The dopants can be incorporated in-situ during silicon carbide (Sic) processing, by using environmental vessel during dopant activation, or by ion implantation technique. The silicon carbide (SiC) material can be integrated on low temperature substrates by any suitable wafer-bonding or chip-bonding techniques and the energy conversion device can be processed prior to or after transfer on low-temperature substrates.

Figure 10:
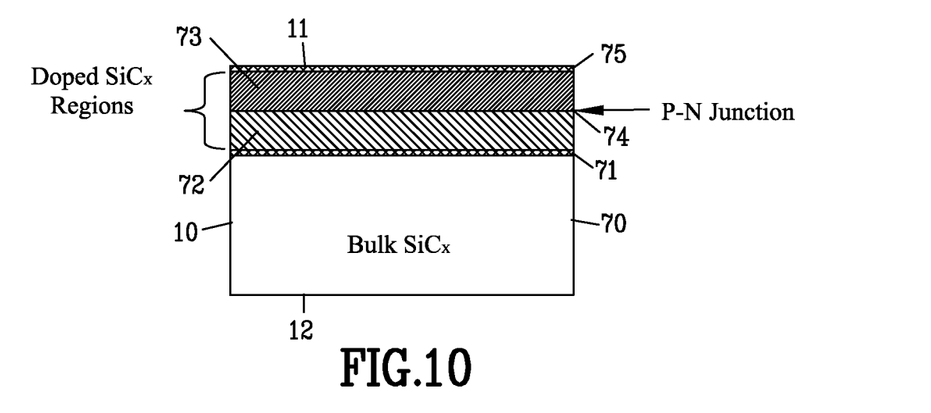
FIG. 10 illustrates a first example of a semiconductor device fabricated using the pulsed plasma lamp apparatus and the laser apparatus of FIGS. 1-4.

FIG. 10 illustrates a first example of a semiconductor device 70 fabricated using the pulsed plasma lamp apparatus 5 and the laser apparatus 6 of FIGS. 1-4. In this example, the semiconductor device 70 is fabricated using a silicon carbide (SIC) material but it should be appreciated by those skilled in the art that other material 10 may be used to fabricate the semiconductor device 70 Other materials suitable for fabricating the semiconductor device 70 include ZnO, AlN, GaN, Si, Ge, SiGe, and silicon carbide regions in silicon.

The semiconductor device 70 is formed from the material 10 defined between the first and second sides 11 and 12. The semiconductor device 70 comprises an electrode 71 diffused into the first side 11 of the material 10. The electrode 71 may be formed by enriching carbon into the silicon carbide (SiC) material. The process of enriching carbon into the silicon carbide (SiC) material may be accomplished by puking the plasma lamp 50 in the presence of a carbon donating fluid atmosphere to diffuse carbon into the material 10.

A doped region 72 is formed within the material 10 to be in Ohmic contact with the electrode 71. The doped region 72 may be either a P-type or an N-type region. The doped region 72 may be formed by pulsing the plasma lamp 50 in the presence of a donor or acceptor fluid atmosphere to diffuse the donor or acceptor atoms into the first side of the material 10

A doped region 73 is formed within the material 10 adjacent to the doped region 72 to form a P-N junction 74 with the doped region 72. The doped region 73 is the other of the P-type or N-type region of the doped region 72. The doped region 73 may be formed by puking the plasma lamp 50 in the presence of a donor or acceptor fluid atmosphere to diffuse the donor or acceptor atoms into the first, side of the material 10.

To form a P-type region in silicon carbide (Sic), a fluid atmosphere of trimethylaluminum is used in concert with either the pulsed plasma lamp apparatus 5 or the laser apparatus 6 of FIGS. 1-4. To form a N-type region in silicon carbide (SiC), a fluid atmosphere of nitrogen is used in concert with either the pulsed plasma lamp apparatus 5 or the laser apparatus 6 of FIGS. 1-4.

The semiconductor device 70 includes an electrode 75 on the first side of the material 10 in Ohmic contact with the doped region 73. The electrode 75 may be formed by enriching carbon into the doped region 73 in a manner similar to forming the electrode 71. In the alternative, the electrode 75 may be formed by adding a conductive layer to the doped region 73. The electrode 75 formed by adding a conducive layer to the doped region 73 may be accomplished by pulsing the plasma lamp 50 in the presence of a nickel donating fluid atmosphere to add to N-type regions and an aluminum donating fluid atmosphere to add to P-type regions of the doped region 73.

Figure 11:
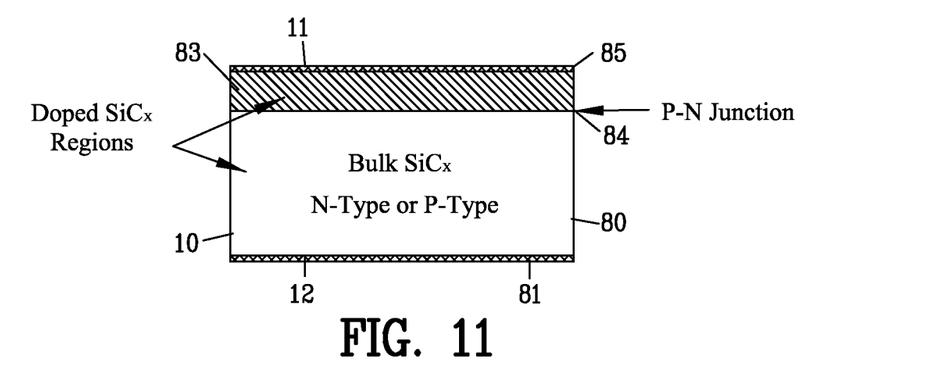
FIG. 11 illustrates a second example of a semiconductor device fabricated using the pulsed plasma lamp apparatus and the laser apparatus of FIGS. 1-4.

FIG. 11 illustrates a second example of a semiconductor device 80 fabricated using the pulsed plasma lamp apparatus 5 and the laser apparatus 6 of FIGS. 1-4. In this embodiment, the material 10 defined between the first and second sides 11 and 12 is a doped material either a N-type or a P-type semiconductor material 10. The semiconductor device 80 includes an electrode 81 in Ohmic contact with the second side 12 of the semiconductor material 10. The electrode 81 may be formed by enriching carbon into the semiconductor material 10 in a manner similar to forming the electrode 71. In the alternative, the electrode Si may be formed by adding a conductive layer to the semiconductor material 10 as heretofore described.

A doped region 83 is formed within the semiconductor material 10 to form a P-N junction 84 with the semiconductor material 10. The doped region 8 is the other of the P-type or N-type region of the semiconductor material 10. The doped region 83 may be formed by pulsing the plasma lamp 50 in the presence of a donor or acceptor fluid atmosphere to diffuse the donor or acceptor atoms into the first side of the material 10.

The semiconductor device 80 includes an electrode 85 on the first side 11 of the material 10 in Ohmic contact with the doped region 83. The electrode 85 may be formed in a manner similar to forming the electrode 81.

Figure 12:
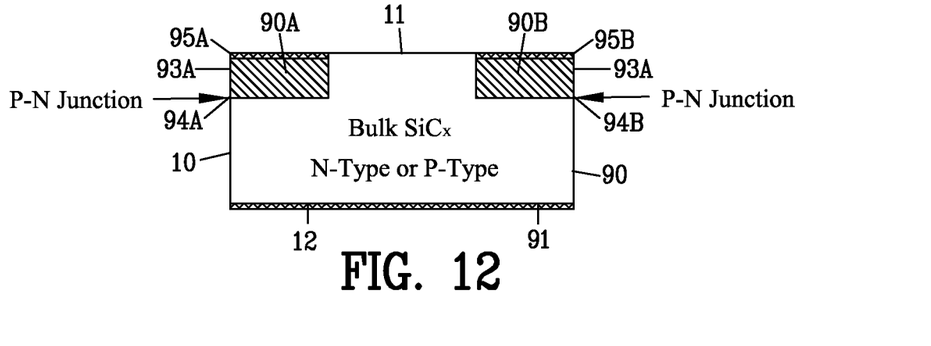
FIG. 12 illustrates a third example of a semiconductor device fabricated using the pulsed plasma lamp apparatus and the laser apparatus of FIGS. 1-4.

FIG. 12 illustrates a third example of a semiconductor device 90 fabricated using the pulsed plasma lamp apparatus 5 and the laser apparatus 6 of FIGS. 1-4. In this embodiment, the semiconductor device 90 comprises a first semiconductor device 90A and a second semiconductor device 90B disposed on a common semiconductor material 10.

The semiconductor device 90 includes a common electrode 91 in Ohmic contact with the second side 12 of the semiconductor material 10. Preferably, the common electrode 91 is formed by pulsing the plasma lamp 50 in the presence of a selected atmosphere to form the common electrode 91.

The first semiconductor device 90A comprises a doped region 93A formed within the semiconductor material 10 to form a P-N junction 94A with the semiconductor material 10. The semiconductor device 90A includes an electrode 95A on the first side 11 of the semiconductor material 10 in Ohmic contact with the doped region 93A. The first semiconductor device 90A is formed by pulsing the laser 60 in the presence of a selected atmosphere to form the first semiconductor device 90A within the semiconductor material 10.

The semiconductor device 90A includes an electrode 95A on the first side 11 of the semiconductor material 10 in Ohmic contact with the doped region 93A. The electrode 95B may be formed by the laser 60 in a manner similar to forming the electrode 81.

The second semiconductor device 90B comprises a doped region 93B formed within the semiconductor material 10 to form a P-N junction 94B with the semiconductor material 10. The semiconductor device 90B includes an electrode 95B on the first side 11 of the semiconductor material 10 in Ohmic contact with the doped region 93B. The second semiconductor device 90B is formed by pulsing the laser 60 in the presence of a selected atmosphere to form the first semiconductor device 90B within the semiconductor material 10.

The semiconductor device 90B includes an electrode 95B on the first side 11 of the semiconductor material 10 in Ohmic contact with the doped region 93B. The electrode 95B may be formed by the laser 60 in a manner similar to forming the electrode 81.

Figure 13:
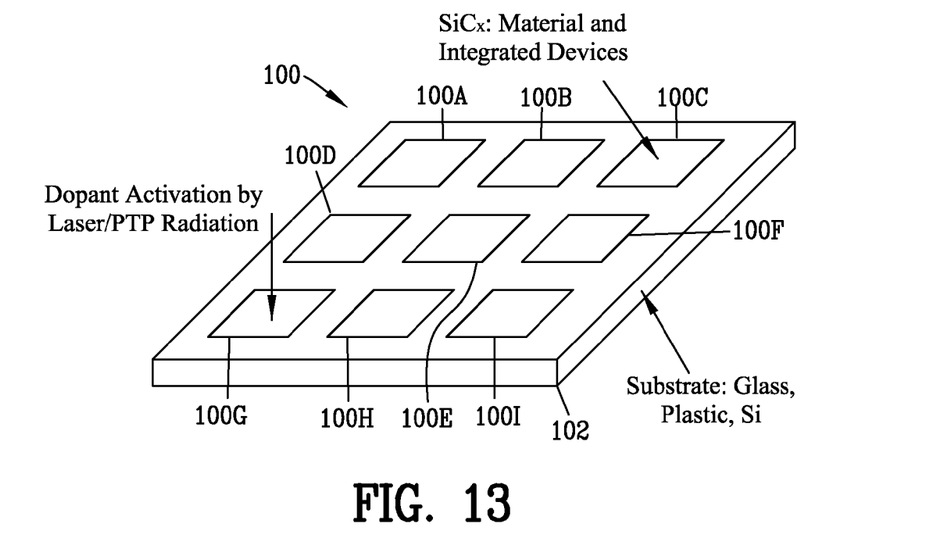
FIG. 13 illustrates a forth example of a semiconductor device fabricated using the pulsed plasma lamp apparatus and the laser apparatus of FIGS. 1-4.

FIG. 13 illustrates a forth example of a semiconductor device 100 fabricated using the pulsed plasma lamp apparatus 5 and the laser apparatus 6 of FIGS. 1-4. In this embodiment, the semiconductor device 100 comprises a multiplicity of integrated circuits 100A-100I formed on a substrate 102. Each of the integrated circuits 100A-100I may be farmed simultaneously by pulsing the plasma lamp 50 in the presence of a specialized atmosphere. In the alternative, each of the integrated circuits 100A-100I may be formed individually by the laser 60 in the presence of a specialized atmosphere. The integrated circuits 100A-100I may be formed through the use of both the plasma lamp 50 and the laser 60.

The short duration of the pulsed plasma lamp 50 and the small diameter of the beam 66 of the laser 60 enable the process to be used on low temperature substrates by any suitable wafer or chip-bonding techniques. This approach decouples the high temperature wide bandgap semiconductor processing steps from the thermal limitations of the low temperature substrates. The dopant activation can be carried out on the blanket wafer or on the sample integrated on suitable substrate such as Si, glass, or plastic. The P-type and N-type regions can be created on either side of the semiconductor depending on the integration scheme. The dopant activation and device fabrication are accomplished by laser or pulse thermal annealing techniques at low thermal levels suitable for integration on low temperature substrates. The energy conversion device can be integrated on top of silicon substrates to interface with Si CMOS drive circuitry. The process can also be integrated on top of glass or plastic substrates by any suitable chip- or wafer-transfer and bonding techniques. The substrate and the wide bandgap semiconductors can be selected such that the dopant activation and device processing can be carried out on both the top and bottom surfaces for enhanced functionality.

Figure 14:
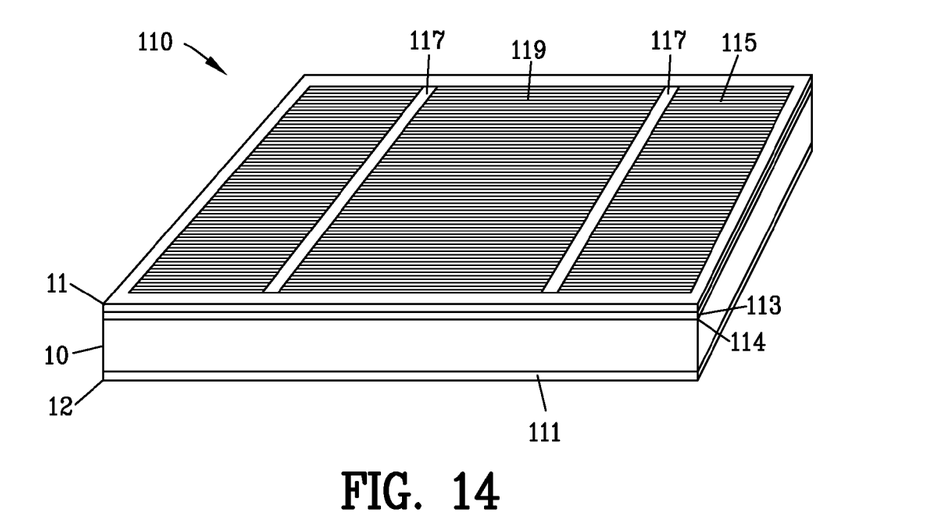
FIG. 14 illustrates a solar collector device fabricated using the pulsed plasma lamp apparatus and laser apparatus of FIGS. 1-4.

FIG. 14 illustrates a solar collector device 110 fabricated using the pulsed plasma lamp apparatus 5 and laser apparatus 6 of FIGS. 1-4. In this embodiment, the solar collector device 110 uses semiconductor material 10 of N-type silicon carbide (SiC). The solar collector device 110 includes an electrode 111 in Ohmic contact with the second side 12 of the N-type silicon carbide (SiC) semiconductor material 10.

A doped P-type region 113 is formed within the N-type silicon carbide (SiC) semiconductor material 10 to form a P-N junction 114 with the N-type silicon carbide (SiC) semiconductor material 10.

The solar collector device 110 includes an electrode 115 on the first side 11 of the N-type silicon carbide (SiC) semiconductor material 10 in Ohmic contact with the doped P-type region 113. In this embodiment, the electrode 115 includes plural bus electrodes 117 and a multiplicity of cross electrodes 119.

Figure 15A:
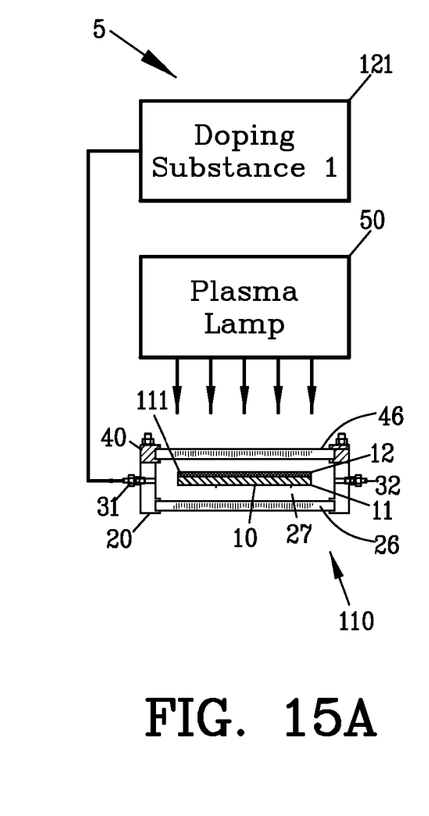
FIG. 15A illustrates a first step in fabricating the solar collector device of FIG. 14.
Figure 15B:
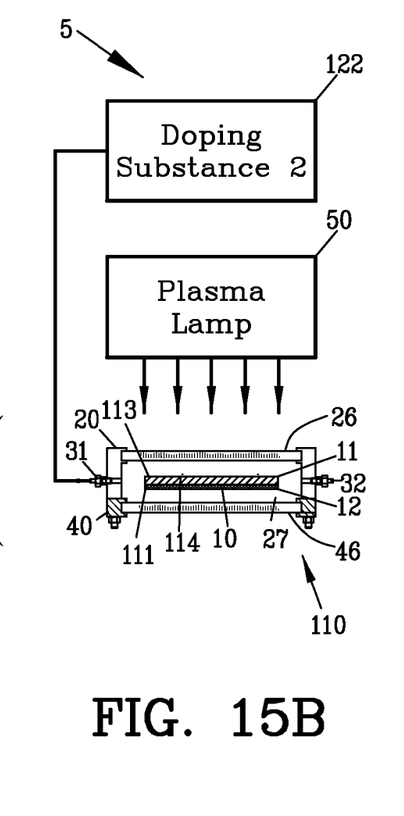
FIG. 15B illustrates a second step in fabricating the solar collector device of FIG. 14.
Figure 15C:
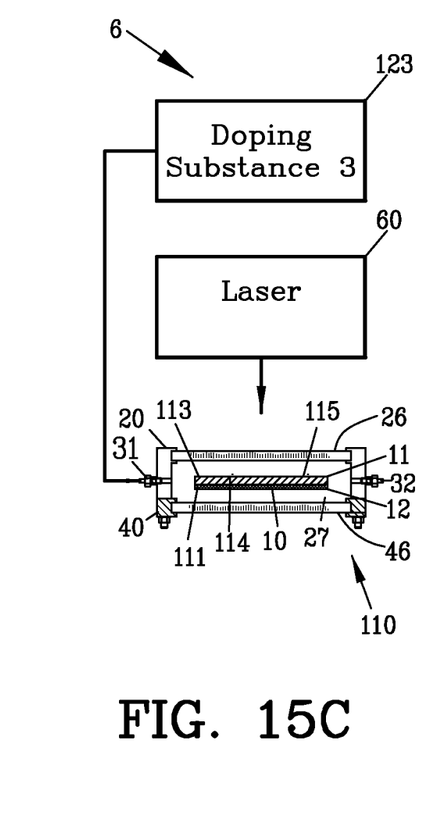
FIG. 15C illustrates a third step in fabricating the solar collector device of FIG. 14.

FIGS. 15A-15C illustrate the steps in fabricating the solar collector device 110 of FIG. 14 using the pulsed plasma lamp apparatus 5 and laser apparatus 6 of FIGS. 1-4. In this embodiment, the semiconductor material 10 is a N-type silicon carbide (SiC) semiconductor material 10 pre-doped with nitrogen (N). The N-type silicon carbide (SiC) semiconductor material 10 is placed within the vessel 20 and the closure 40 is secured thereto.

FIG. 15A illustrates a first step in fabricating the solar collector device 110 of FIG. 14 for forming the electrode 111 on the second side 12 of the semiconductor material 10. The vessel 20 and the closure 40 are positioned as shown in FIGS. 1 and 2. A first doping substance 121 is introduced into the vessel 20 through the inlet port 31. In this embodiment, a nickel flake powder containing fluid is introduced into the vessel 20 onto the substrate. The plasma lamp 50 is pulsed through the window 46 in the presence of the nickel flake powder containing fluid to form a nickel electrode 111. After the nickel electrode 111 is formed, the nickel flake powder containing fluid is removed and the vessel 20 and the closure 40 through the outlet port 32.

FIG. 15B illustrates a second step in fabricating the solar collector device 110 of FIG. 14. The vessel 20 and the closure 40 are inverted from the position shown in FIGS. 1 and 2. A second doping substance 122 is introduced into the vessel 20 through the inlet, port 31. In this embodiment, dilute trimethyl aluminum (TMA) plus argon mixture is introduced into the vessel 20. The plasma lamp 50 is pulsed through the window 26 in the presence of the trimethylaluminum (TMA) plus argon mixture to form a doped P-type region 1.13 within the N-type silicon carbide (SiC) semiconductor material 10. A P-N junction 114 is formed between the N-type silicon carbide (SiC) semiconductor material 10 and the doped P-type region 113. After the doped P-type region 113 is formed, the trimethylaluminum (TMA) plus argon mixture is removed and the vessel 20 and the closure 40 through the outlet port 32.

FIG. 15C illustrates a third step in fabricating the solar collector device 110 of FIG. 14. A third doping substance 123 is introduced into the vessel 20 through the inlet port 31. In this embodiment an aluminum flake powder containing fluid is introduced into the vessel 20 onto the substrate. The laser 60 is projected through the window 26 in the presence of the aluminum flake powder containing fluid to form electrode 115 including the plural bus electrodes 117 and the multiplicity of cross electrodes 119.

The use of the vessel 20 and closure 40 with the windows 26 and 46 enables both the first and second side 11 and 12 of the material 10 to be processed by either the pulsed plasma lamp apparatus 5 and laser apparatus 6 of FIGS. 1-4. Furthermore, the inlet ports 31 and the outlet port 32 allows the various doping substances 121-123 to be introduced and removed from the vessel 20 and closure 40. The combination enables complete processing of the material 10 without removal from the vessel 20 and closure 40. It should be appreciated by those skilled in the art that the various process steps and the inversion of the vessel and closure 40 is only by way of example and numerous variations are considered to be with the scope within the present invention, in addition, various other process steps may be incorporated in the process of the present invention such as cleaning materials activating doping materials and the like.

The present invention provides an improved process and apparatus for fabricating solid-state devices. The solid-state devices may be processed on low cost substrates and on either side of the substrate with localized radiation exposure. The solid-state device structure can be single layer or multilayer with suitably doped SiCx thin films. Dopant activation is possible for low temperatures (<600° C.) substrates such as glass or plastic.

Pulsed thermal processing of the present invention minimizes the heat affect zone allowing doping to nano size depths facilitating sharp P-N junction regions on the nanoscale in wafers and monolithic substrates. This P-N junction engineering reduces processing steps compared to the combined steps of conventional thin film epitaxy processing to fabricate P-N junctions.

The process present invention applies to substantially all indirect bandgap semiconductors including silicon, silicon carbide, boron nitride, aluminum nitride, diamond, DLC, gallium phosphide. The dopants for solid state devices include Al, Sc, Cr, V, N, from gaseous, metalorganic or solid (thin film, powder etc) precursors. The process is applicable to direct bandgap semiconductors (GaN, ZnO) and their dopants.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for processing an insulator material or a semiconductor material, comprising the steps of:
    placing the material into a vessel;
    introducing a first substance into the vessel;
    pulsing a plasma lamp onto the material in the presence of the first substance to treat a large area of the material with the first substance;
    introducing a second substance into the vessel;
    pulsing a laser onto a selected region of the material to treat a selected area of the material with the second substance; and
    removing the treated material from the vessel.

2. A method as set forth in claim 1 wherein the step of treating a large area of the material with the first substance includes diffusing the first substance into the material.

3. A method as set forth in claim 1 wherein the step of treating a large area of the material with the first substance includes activating a doping material within the material.

4. A method as set forth in claim 1 wherein the step of treating a large area of the material with the first substance includes metallizing the first substance onto the large area of the material.

5. A method as set forth in claim 1 wherein the step of treating the selected area of the material of the material with the second substance includes diffusing the second substance into the material.

6. A method as set forth in claim 1 wherein the step of treating the selected area of the material with the second substance includes activating a doping material within the material.

7. A method as set forth in claim 1 wherein the step of treating the selected area of the material of the material with the second substance includes metallizing the second substance onto the selected area of the material.

8. A method as set forth in claim 1 including the step of removing the first substance from the vessel prior to introducing the second substance into the vessel.

9. A method as set forth in claim 1 wherein the step of introducing a first substance into the vessel includes introducing a first fluid into the vessel.

10. A method as set forth in claim 1 wherein the step of introducing a first substance into the vessel includes introducing a first powder into the vessel.

11. A method for processing a large scale insulator material or a large scale semiconductor material, comprising the steps of:
    placing the material into a vessel;
    directing a doping gas into the vessel to contact a surface of the material;
    pulsing a plasma lamp for directing electromagnetic radiation into the vessel and onto the surface of the material to diffuse atoms from the doping gas into the material; and
    terminating the pulsing of the plasma lamp upon sufficient diffusion of the atoms from the doping gas into the material to transform a portion of the material into a doped material.

12. A method as set forth in claim 11, wherein the step of placing the material
into a vessel, includes placing the material into a vessel; and
evacuating the atmosphere from the vessel.

13. A method as set forth in claim 11, wherein the step of applying a doping substance to the surface of the material includes applying a doping gas to the surface of the material.

14. A method as set forth in claim 11, wherein the step of applying a doping substance to the surface of the material includes applying a doping powder to the surface of the material.

15. A method as set forth in claim 11, wherein the step of pulsing the plasma lamp includes pulsing a Xenon plasma lamp having principal peaks at 450 nm and 550 nm.

16. A method as set forth in claim 11, wherein the step of pulsing the plasma lamp includes pulsing a Xenon plasma lamp at a peak power of 0.9 KW/cm$^2$.

17. A method as set forth in claim 11, wherein the step of pulsing the plasma lamp includes pulsing a Xenon plasma lamp having a pulse duration equal to or less than 0.4 seconds.

18. A method as set forth in claim 11, wherein the step of pulsing the plasma lamp includes pulsing a Xenon plasma lamp for 25 pulses or less.

19. A method for processing an insulator material or a semiconductor material, comprising the steps of:
   placing the material into a vessel;
   introducing a metal precursor substance into the vessel;
   pulsing a plasma lamp onto the material in the presence of the metal precursor to fuse a metallizing substance onto large areas of the material;
   pulsing a laser onto a selected area of the material to fuse the metallizing substance onto the selected area of the material; and
   removing the metallized material from the vessel.

20. A method for processing an insulator material or a semiconductor material, comprising the steps of:
   placing the material into a vessel;
   introducing a metal precursor substance into the vessel;
   pulsing a plasma lamp onto the material in the presence of the metal precursor to phase transform a large area of the material into a metallization composition;
   pulsing a laser onto a selected area of the material to phase transform the selected area of the material into a metallization composition; and
   removing the metallized material from the vessel.

21. A method for processing an insulation material or a semiconductor material, comprising the steps of:
   placing the material into a vessel;
   introducing an inert or reactive gas,
   pulsing a plasma lamp onto the material in the presence of the inert or reactive gas phase for transforming or for converting the substrate material to an electrically conductive material substance into a large area of the material;
   pulsing a laser onto as selected area of the material in the presence of the inert or reactive gas phase for transforming or for converting the substrate material to an electrically conductive material substance into the selected, areas of the material; and
   removing the electrically conductive material from the vessel.

* * * * *